(12) United States Patent (10) Patent No.: US 8,595,604 B2
Hijazi et al. (45) Date of Patent: Nov. 26, 2013

(54) METHODS AND APPARATUS FOR SEARCH SPHERE LINEAR BLOCK DECODING

(75) Inventors: Samer Hijazi, Bethlehem, PA (US); Carl Murray, Ballybrack (IE); Joseph H. Othmer, Ocean, NJ (US); Albert Molina, Madrid (ES); Kameran Azadet, Morganville, NJ (US)

(73) Assignee: LSI Corporation, San Jose, CA (US)

( * ) Notice: Subject to any disclaimer, the term of this patent is extended or adjusted under 35 U.S.C. 154(b) by 250 days.

(21) Appl. No.: 13/247,439

(22) Filed: Sep. 28, 2011

(65) Prior Publication Data

US 2013/0080855 A1 Mar. 28, 2013

(51) Int. Cl.
 *H03M 13/00* (2006.01)
(52) U.S. Cl.
 USPC ............................................ 714/785; 714/776
(58) Field of Classification Search
 USPC .................................................. 714/785, 776
 See application file for complete search history.

(56) References Cited

U.S. PATENT DOCUMENTS

| | | | |
|---|---|---|---|
| 6,543,026 B1* | 4/2003 | Dadurian | 714/785 |
| 2003/0159103 A1* | 8/2003 | Mizrachi et al. | 714/782 |
| 2007/0011598 A1* | 1/2007 | Hassner et al. | 714/801 |
| 2009/0086839 A1* | 4/2009 | Xu et al. | 375/262 |
| 2010/0299575 A1* | 11/2010 | Roth et al. | 714/755 |

\* cited by examiner

*Primary Examiner* — M. Mujtaba K Chaudry
(74) *Attorney, Agent, or Firm* — Ryan, Mason & Lewis, LLP

(57) ABSTRACT

A search sphere-based linear block decoder is provided. A received vector, v, is decoded by computing a syndrome vector, S, corresponding to the received vector, v; (S=vH); obtaining a set of all possible error vectors, e, corresponding to the computed syndrome vector, S, wherein the set of all possible error vectors, e, is obtained from a pre-computed error table and has a specified maximum number of bit errors; calculating a set of all possible received vectors, x, based on the received vector, v, and the set of all possible error vectors, e; determining a k-bit code-vector x that is closest to the received vector, v; and determining an n-bit data-vector, d, associated with the k-bit code-vector x. The pre-computed error table can be generated by multiplying all possible error vectors by a Syndrome Matrix, to obtain all possible syndrome vectors associated with all possible error vectors.

20 Claims, 5 Drawing Sheets

| e | S = e H |
|---|---|
| 0 0 0 0 0 0 | 0 0 0 |
| 0 0 0 0 0 1 | 1 0 1 |
| 0 0 0 0 1 0 | 0 1 1 |
| 0 0 0 1 0 0 | 1 1 0 |
| 0 0 1 0 0 0 | 0 0 1 |
| 0 1 0 0 0 0 | 0 1 0 |
| 1 0 0 0 0 0 | 1 0 0 |
| 0 1 0 0 0 1 | 1 1 1 |

FIG. 6

PRE-COMPUTED ERROR TABLE EXTRACTION PROCESS
600

610 — LOAD ('syndromTable.mat')

620 — % syndVecExample = randint(1, 10, [0 1]);

630 — syndVecExample = [0 0 0 0 0 0 0 1 1];

640 — NumberOfPossibleErrors = 4;

650 — possibleErrorVectors = syndromTable{binvec2dec(syndVecExample)+1, NumberOfPossibleErrors}'

METHODS AND APPARATUS FOR SEARCH SPHERE LINEAR BLOCK DECODING

FIELD OF THE INVENTION

The present invention relates generally to linear block decoding and, more particularly, to improved techniques for linear block decoding with reduced complexity.

BACKGROUND OF THE INVENTION

In digital communications, a channel code is used to protect data sent over a channel for storage or retrieval in the presence of noise or other errors. A channel code typically achieves the protection by employing forward error correction or bit interleaving (or both). Channel codes typically comprise convolutional codes or block codes. Block codes accept k information bits and generate n coded bits. Block codes are primarily used for error detection or correction in data transmissions.

A linear block code is an error-correcting code for which any linear combination of codewords is another codeword of the code. An (n, k) linear block coder generates an n-bit coded output for each k-bit input, where n is greater than k. The additional n minus k bits introduced into the bit stream by the linear block coder are added to detect errors and/or remove errors at the receiver. For example, a (6, 3) linear block coder generates a 6-bit coded output for each 3-bit input. There are eight possible 3-bit inputs, and there are 64 possible 6-bit coded outputs that can be generated by the linear block coder. FIG. 1A illustrates an exemplary conventional linear block coder 120. As shown in FIG. 1A, the linear block coder 120 receives one of eight possible 3-bit inputs 110 and, for a given input, generates a corresponding 6-bit coded output 130. The particular exemplary linear block code shown in FIG. 1A demonstrates the property that the final three output bits are equal to the three input bits.

At the receiver, a channel decoder performs an inverse operation of the channel coder. In other words, the channel decoder attempts to map each set of incoming n bits to the original set of k bits that was transmitted. The channel decoder uses the additional n minus k bits introduced into the bit stream by the linear block coder 120 to detect and/or remove errors that occur during transmission.

While existing linear block decoding techniques can effectively detect and/or remove errors that occur during transmission, they suffer from a number of limitations, which if overcome, could further improve the reliability and efficiency of linear block decoding techniques. It can be shown that in an additive white Gaussian noise (AWGN) channel; the maximum likelihood (ML) criterion is the optimal reception method from a bit-error-rate (BER) perspective. The computation complexity of an ML technique, however, is prohibitive, as it requires measuring the Euclidean distance between the received vector and all possible codewords. The codeword with the minimum distance is determined to be the most likely vector that minimizes the BER.

A need therefore exists for methods and apparatus for ML-based linear block decoding that demonstrate a reduced computational complexity, relative to the above-described conventional techniques.

SUMMARY OF THE INVENTION

Generally, methods and apparatus are provided for search sphere-based linear block decoding. A search sphere containing all possible codewords with a specific number of bit errors is formed around the hard-received vector. Then, the closest vector within the search sphere to the received vector is selected as the decoded codeword.

According to one aspect of the invention, a method is provided for decoding a received vector, v. A syndrome vector, S, is computed corresponding to the received vector, v; (S=vH); and then a set of all possible error vectors, e, is obtained corresponding to the computed syndrome vector, S, wherein the set of all possible error vectors, e, is obtained from a pre-computed error table and has a specified maximum number of bit errors. A set of all possible received vectors, x, is calculated, based on the received vector, v, and the set of all possible error vectors, e. A k-bit code-vector x is determined that is closest to the received vector, v; and an n-bit data-vector, d, associated with the k-bit code-vector x is then determined.

According to a further aspect of the invention, the pre-computed error table is generated by multiplying all possible error vectors by a Syndrome Matrix, to obtain all possible syndrome vectors associated with all possible error vectors. The pre-computed error table provides a search sphere of possible error vectors around the received vector.

A more complete understanding of the present invention, as well as further features and advantages of the present invention, will be obtained by reference to the following detailed description and drawings.

BRIEF DESCRIPTION OF THE DRAWINGS

FIG. 6 illustrates exemplary pseudo code for a Pre-Computed Error Table Extraction Process that extracts the set of all possible error vectors, e, having a specified maximum number of bit errors from the Pre-Computed Error Table of FIG. 5, for a given syndrome vector, S.

DETAILED DESCRIPTION

The present invention provides methods and apparatus for search sphere-based linear block decoding. Generally, as discussed herein, a search sphere is formed around the hard-received vector h containing all possible codewords with a specific number of bit errors. Then, the ML criterion is utilized to find the closest vector in a Euclidian sense to the received vector. In this manner, the search space is significantly reduced, thereby reducing the computational complexity of the disclosed search sphere-based linear block decoder, relative to the above-described conventional techniques.

The following discussion of linear block coding and linear block decoding is based on a discussion in Carl Nassar, Telecommunications Demystified: A Streamlined Course in Digital Communications (and some Analog) for EE Students and Practicing Engineers, 177-192, LLH Technology Publishing (1968), incorporated by reference herein.

Linear Block Coding

A linear block coder 120 typically generates the n-bit coded output for each k-bit input using a look-up table or a generator matrix. A look-up table, however, can quickly get large and expensive as it requires one input-output pair for each possible k-bit input. For example, for a (127, 92) linear block code, the corresponding look-up table has approximately $10^{28}$ possible 92-bit pairs.

Alternatively, the linear block coder 120 can generate the n-bit coded output for each k-bit input using a generator matrix. Given the k-bit input, in the form of a vector m, such as (1 0 1), the linear block coder 120 generates the n output bits in the form of a vector u, such as (0 1 1 1 0 1), using a matrix multiplication, as follows:

$$u=mG.$$

where G is a k by n matrix of 0's and 1's referred to as the generator matrix. Thus, the linear block coder 120 only has to store the generator matrix, G, which is only n·k bits.

Linear Block Decoding

Figure 1A:
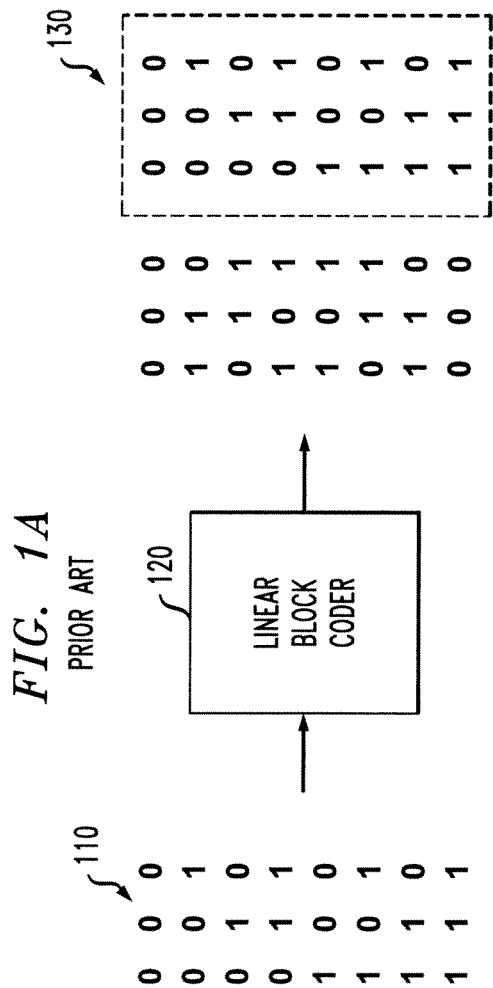
FIGS. 1A and 1B illustrate an exemplary conventional linear block encoder and an exemplary conventional linear block decoder, respectively.

Assume that the exemplary (6, 3) linear block coder 120 maps input bits to output bits as shown in FIG. 1A. Thus, the corresponding linear block decoder sees a 6-bit set at its input. Assume further that the linear block coder 120 transmitted a coded output of (0 1 1 1 0 1) (for an exemplary 3 bit input of (1 0 1)). The transmitted coded output may arrive at the linear block decoder without any bit errors (i.e., the received vector is (0 1 1 1 0 1)) or the transmitted coded output might arrive at the linear block decoder with one or more bit errors (for example, the received vector is (1 1 1 1 0 1)). The linear block decoder attempts to determine the 3-bit set that was input to the channel coder 120. With the current example, the decoder will attempt to determine that (1 0 1) was the original input. If there are no errors in the 6-bit received vector, then the determination that (1 0 1) was the original input is relatively trivial.

Figure 1B:
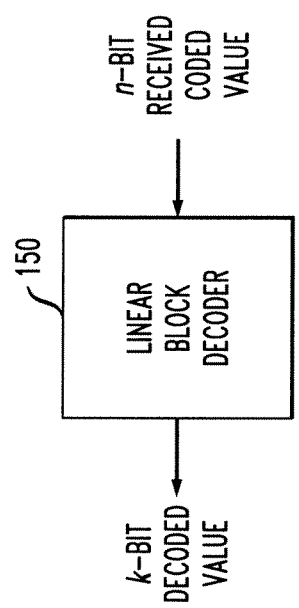

FIG. 1B illustrates an exemplary conventional linear block decoder 150. As shown in FIG. 1B, the linear block decoder 150 receives an n-bit coded value that was transmitted. For a given n-bit coded value, the linear block decoder 150 generates a corresponding one of eight possible k-bit decoded values that corresponds to the original input.

Continuing the present example, if there are errors in the 6-bit received vector, the linear block decoder 150 will attempt to correct the errors and determine that (1 0 1) was sent. Generally, the linear block decoder 150 evaluates the received vector, and corrects errors as best as it can (if there are any), and then determines the 3-bit input that was sent. For example, if the decoder 150 receives a vector of (1 1 1 1 0 1), the linear block decoder 150 can determine that this is not one of the eight possible channel coder outputs, due to some error. The linear block decoder 150 considers which of the eight possible channel coder outputs of FIG. 1A is closest to the received vector of (1 1 1 1 0 1). The linear block decoder 150 determines that the closest possible channel coder outputs is (0 1 1 1 0 1), because this differs from the received 6-bit vector by only one bit. The linear block decoder 150 can thus correct the detected channel error. Now, with the error corrected, the linear block decoder 150 uses the mapping of FIG. 1A to determine that (1 0 1) was the original input to the coder.

Mathematically, the conventional linear block decoding process can be expressed as follows, using a parity check matrix, H. Given a generator matrix, G, employed by the linear block coder 120, then the parity check matrix H is defined as the matrix that satisfies the following equation:

$$GH=0$$

where 0 refers to an all-zeros matrix. In other words, H is the matrix that when multiplied by G produces zero. For example, for the exemplary (6, 3) linear block code discussed herein, the generator matrix can be expressed as follows:

$$G = \begin{pmatrix} P_{11} & P_{12} & P_{13} & \vdots & 1 & 0 & 0 \\ P_{21} & P_{22} & P_{23} & \vdots & 0 & 1 & 0 \\ P_{31} & P_{32} & P_{33} & \vdots & 0 & 0 & 1 \end{pmatrix}$$

where the matrix P comprises k·(n−k) binary elements. The corresponding parity check matrix can be expressed as follows:

$$H = \begin{pmatrix} I_{3\times 3} \\ P_{3\times 3} \end{pmatrix}.$$

It can be shown that whenever there is no error in the received vector, multiplying the exemplary received 6-bit vector by the parity check matrix H provides a zero result, and whenever there is an error, multiplying the received 6-bit error by the parity check matrix H provides a non-zero result. Thus, the linear block decoder 150 can use the parity check matrix H to detect errors.

Assume that the linear block coder 120 sent a 6-bit set u=m G=(0 1 1 1 0 1), for a 3-bit input m. If the received vector v does not match what was sent from the channel coder 120, an error occurred in the channel. Consider the case where the received vector v=(1 1 1 1 0 1). In this case, the received vector v can be expressed as follows:

$$v=u+e,$$

where u is the sent sequence (0 1 1 1 0 1) and e is the error, represented as (1 0 0 0 0 0). If the received vector v is multiplied by the parity check matrix H, then:

$$vH=uH+eH=mGH+eH=m0+eH=0+eH=eH=$$
$$(100000)H=(1\ 0\ 0),$$

which is a non-zero result.

Generally, linear block decoders 150 map the v H result to a predicted error. For example, if the result is (1 0 0), then the assumed error e=(1 0 0 0 0 0), which can then be used to correct for this error. The v H vector result is typically referred to as a syndrome, S. Thus, $$vH=eH=S.$$

Figures 2, 3:
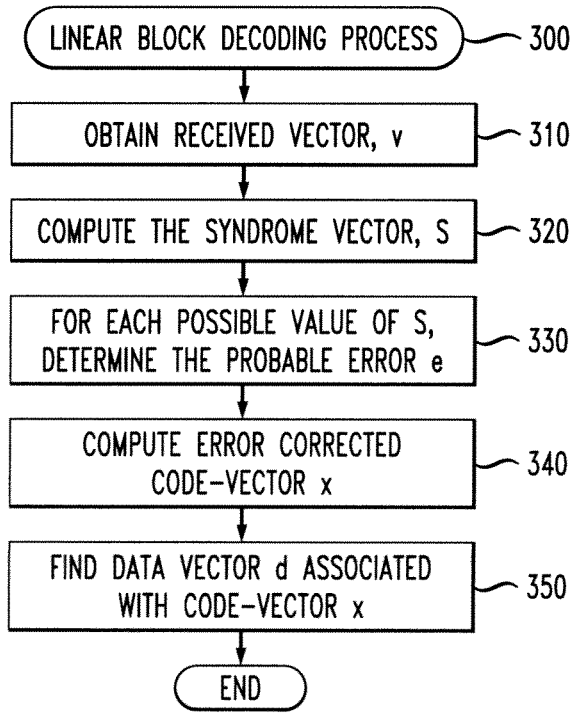
FIG. 2 is a sample table illustrating an exemplary mapping of predicted errors to corresponding syndrome values, for an exemplary (6, 3) linear block code discussed herein.
FIG. 3 is a flow chart describing an exemplary implementation of a conventional linear block decoding process.

Linear block decoders 150 typically map each possible syndrome value to a corresponding predicted error (using eH=S). First, the most common errors (one-bit errors, such as (010000) and (00010000)) are mapped to the corresponding syndrome value (using eH=S). Thereafter, the two-bit errors are considered, and so on, until all of the possible syndrome values are mapped to a corresponding predicted error. FIG. 2 is a sample table illustrating an exemplary mapping 200 of predicted errors to corresponding syndrome values, for the exemplary (6, 3) linear block code discussed herein. It is again noted, however, that a look-up table can quickly get large and expensive as it requires one Syndrome-predicted error pair for each possible k-bit Syndrome. Thus, a linear block decoder will typically determine the probable error e for each possible value of S, starting with the most common errors (i.e., one-bit errors), and then considering two-bit errors, and so on.

FIG. 3 is a flow chart describing an exemplary implementation of a conventional linear block decoding process 300. As shown in FIG. 3, the linear block decoding process 300 initially obtains the received vector, v, during step 310. Thereafter, the linear block decoding process 300 computes the syndrome vector S, during step 320, as follows:

$$S=vH.$$

For each possible value of S, the linear block decoding process 300 then determines the probable error e, during step 330. As previously indicated, the linear block decoding process 300 initially starts with the most common errors (i.e., the one-bit errors), and then processes the two-bit errors, and so on.

The minimum bit error vector associated with S is determined during step 340, and then the error corrected code-vector x is computed as follows:

$$x=XOR(v,e).$$

Finally, the linear block decoding process 300 determines the data vector d associated with the code-vector x during step 350. Program control then terminates.

Search Sphere Linear Block Decoding

As previously indicated, the present invention provides methods and apparatus for search sphere-based linear block decoding. Generally, as discussed herein, a search sphere of possible error vectors is formed around the received vector containing all possible codewords with a specific number of bit errors. As discussed further below in conjunction with FIG. 5, the search sphere of possible error vectors is obtained from a Pre-Computed Error Table 500. Then, the ML criterion is utilized to find the closest vector in the search sphere, in a Euclidian sense, to the received vector. In this manner, the search space is significantly reduced, thereby reducing the computational complexity of the disclosed search sphere-based linear block decoder, relative to the above-described conventional techniques.

Figure 4:
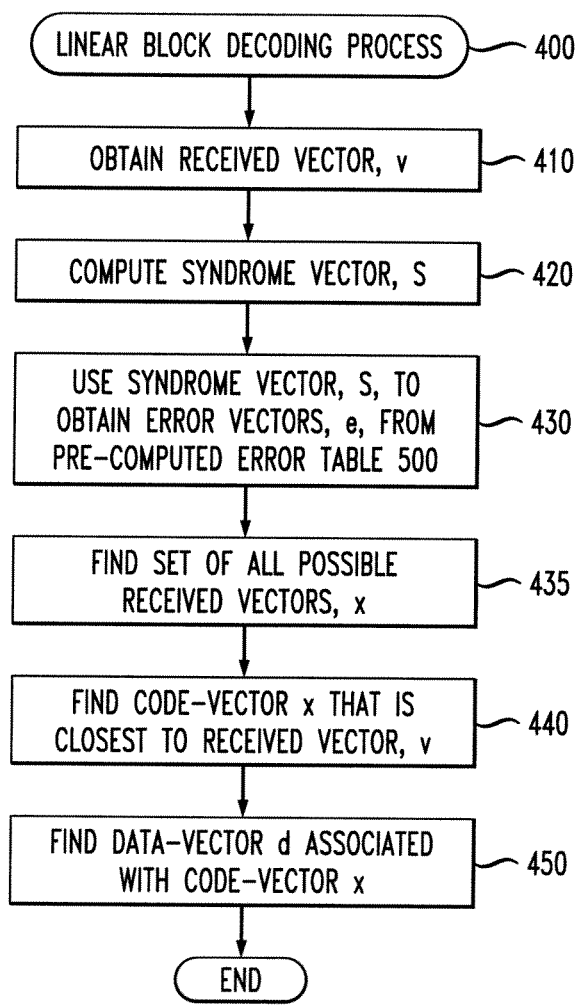
FIG. 4 is a flow chart describing an exemplary implementation of a search sphere linear block decoding process incorporating aspects of the invention.

FIG. 4 is a flow chart describing an exemplary implementation of a search sphere linear block decoding process 400 incorporating aspects of the invention. As shown in FIG. 4, the search sphere linear block decoding process 400 initially obtains the received vector, v, during step 410. Thereafter, the search sphere linear block decoding process 400 computes the syndrome vector S, during step 420, as follows:

$$S=vH.$$

The computed syndrome vector, S, is then used as an index into a Pre-Computed Error Table 500, discussed further below in conjunction with FIG. 5, to obtain the corresponding set of all possible error vectors, e, having a specified maximum number of bit errors. A Pre-Computed Error Table Extraction Process 600 is discussed further below in conjunction with FIG. 6 that extracts the set of all possible error vectors, e, having a specified maximum number of bit errors from the larger Pre-Computed Error Table 500.

The set of all possible received vectors, x, is calculated during step 435, as follows:

$$x=XOR(v,e).$$

The k-bit code-vector x that is closest in a Euclidian sense to the received vector, v, is determined during step 440.

Finally the n-bit data-vector, d, associated with the code-vector x is determined during step 450. Program control then terminates.

Figure 5:
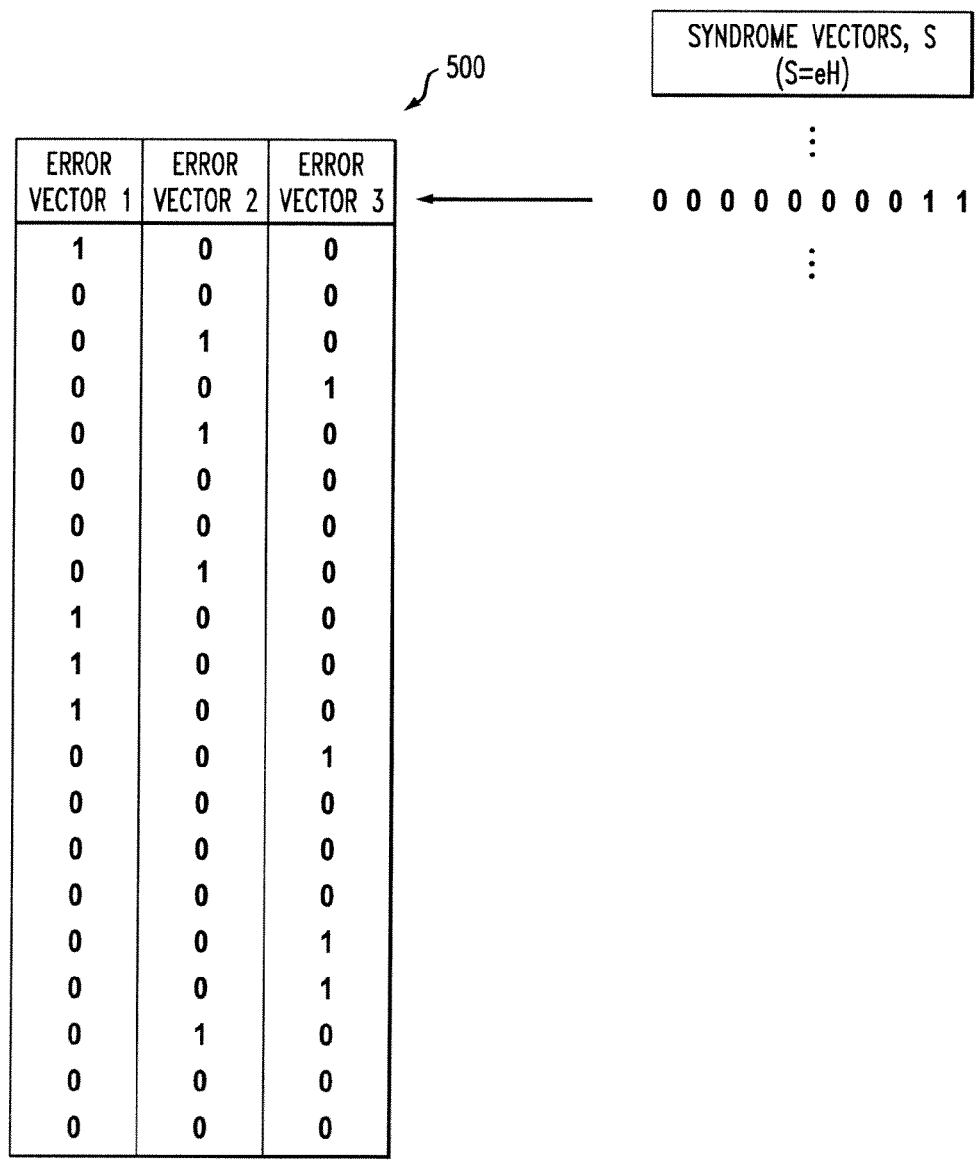
FIG. 5 is a sample table illustrating an exemplary Pre-Computed Error Table containing a search sphere in accordance with the present invention around the received vector.

As previously indicated, a Pre-Computed Error Table 500, shown in FIG. 5, is maintained to extract a search sphere around the hard-received vector h containing all possible codewords with a specific number of bit errors. Generally, the Pre-Computed Error Table 500 can record the error vectors associated with each syndrome vector for any number of bit errors, and the error vectors for a specified maximum number of bit errors can be extracted. As shown in FIG. 5, each syndrome vector, S, is used as an index into the Pre-Computed Error Table 500 to extract the corresponding error vectors, e, having the specified maximum number of bit errors. For the example shown in FIG. 5, where the maximum number of bit errors that can be corrected is four, the exemplary syndrome vector, S, equal to 0000000011, has three associated 20-bit long error vectors (each having four binary ones).

Generally, the Pre-Computed Error Table 500 is obtained by multiplying all possible error vectors by the Syndrome Matrix, to obtain the set, S, of all possible syndrome vectors associated with all possible error vectors, as follows:

$$S=EH.$$

where E is the set of all possible errors (one-bit errors, 2-bit errors, . . . , M-bit errors). The table is created by mapping the one-bit errors to the corresponding syndrome value (using eH=s); and then the two-bit errors are considered, and so on, until all error vectors are mapped to one or more corresponding syndrome vectors.

FIG. 6 illustrates exemplary pseudo code for a Pre-Computed Error Table Extraction Process 600 that extracts the set of all possible error vectors, E, having a specified maximum number of bit errors from the larger Pre-Computed Error Table 500, for a given syndrome vector, S.

As shown in FIG. 6, the Pre-Computed Error Table 500 is loaded during step 610 and the code parameters are specified during step 620. The particular syndrome vector, S, for which the error vectors are required is specified during step 630 and the maximum number of possible errors is specified during step 640. Finally, the set of possible error vectors, e, for a specific syndrome vector, s, is extracted from the Pre-Computed Error Table 500 during step 650.

As previously indicated, the arrangements of linear block decoders, as described herein, provide a number of advantages relative to conventional arrangements. Again, it should be emphasized that the above-described embodiments of the invention are intended to be illustrative only. In general, the exemplary linear block decoders can be modified, as would be apparent to a person of ordinary skill in the art, to incorporate search sphere linear block decoding schemes. In addition, the disclosed search sphere linear block decoding techniques can be employed in any decoding system.

While exemplary embodiments of the present invention have been described with respect to processing steps in a software program, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit, micro-controller, or general-purpose computer. Such hardware and software may be embodied within circuits implemented within an integrated circuit.

In an integrated circuit implementation of the invention, multiple integrated circuit dies are typically formed in a repeated pattern on a surface of a wafer. Each such die may include a device as described herein, and may include other structures or circuits. The dies are cut or diced from the wafer, then packaged as integrated circuits. One skilled in the art would know how to dice wafers and package dies to produce packaged integrated circuits. Integrated circuits so manufactured are considered part of this invention.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

We claim:

1. A method for decoding a received vector, v, comprising:
obtaining said received vector, v;
computing a syndrome vector, S, corresponding to said received vector, v;

$$S=vH$$

obtaining a set of all possible error vectors, e, corresponding to said computed syndrome vector, S, wherein said set of all possible error vectors, e, is obtained from a pre-computed error table and has a specified maximum number of bit errors;
calculating a set of all possible received vectors, x, based on said received vector, v, and said set of all possible error vectors, e,
determining a k-bit code-vector x that is closest to said received vector, v; and
determining an n-bit data-vector, d, associated with the k-bit code-vector x.

2. The method of claim 1, wherein said computing step computes said syndrome vector S, as follows:

$$S=vH$$

where H is a parity check matrix.

3. The method of claim 1, wherein said pre-computed error table is generated by multiplying all possible error vectors by a Syndrome Matrix, to obtain all possible syndrome vectors associated with all possible error vectors.

4. The method of claim 3, wherein said pre-computed error table provides a search sphere of possible error vectors around said received vector.

5. The method of claim 1, wherein said step of determining said k-bit code-vector x that is closest to said received vector, v, applies a maximum likelihood criterion.

6. The method of claim 1, wherein said set of all possible received vectors, x, is calculated as follows:

$$x=XOR(v,e).$$

7. The method of claim 1, wherein said determined k-bit code-vector x is closest in a Euclidian sense to said received vector, v.

8. A linear block decoder, comprising:
a memory; and
at least one hardware device, coupled to the memory, operative to:
obtain said received vector, v;
compute a syndrome vector, S, corresponding to said received vector, v;

$$S=vH$$

obtain a set of all possible error vectors, e, corresponding to said computed syndrome vector, S, wherein said set of all possible error vectors, e, is obtained from a pre-computed error table and has a specified maximum number of bit errors;
calculate a set of all possible received vectors, x, based on said received vector, v, and said set of all possible error vectors, e,
determine a k-bit code-vector x that is closest to said received vector, v; and
determine an n-bit data-vector, d, associated with the k-bit code-vector x.

9. The linear block decoder of claim 8, wherein said syndrome vector S, is computed as follows:

$$S=vH$$

where H is a parity check matrix.

10. The linear block decoder of claim 8, wherein said pre-computed error table is generated by multiplying all possible error vectors by a Syndrome Matrix, to obtain all possible syndrome vectors associated with all possible error vectors.

11. The linear block decoder of claim 10, wherein said pre-computed error table provides a search sphere of possible error vectors around said received vector.

12. The linear block decoder of claim 8, wherein said k-bit code-vector x that is closest to said received vector, v, is determined by applying a maximum likelihood criterion.

13. The linear block decoder of claim 8, wherein said set of all possible received vectors, x, is calculated as follows:

$$x=XOR(v,e).$$

14. The linear block decoder of claim 8, wherein said determined k-bit code-vector x is closest in a Euclidian sense to said received vector, v.

15. An article of manufacture for decoding a received vector, v, comprising a tangible machine readable recordable medium containing one or more programs which when executed implement the steps of:
obtaining said received vector, v;
computing a syndrome vector, S, corresponding to said received vector, v;

$$S=vH$$

obtaining a set of all possible error vectors, e, corresponding to said computed syndrome vector, S, wherein said set of all possible error vectors, e, is obtained from a pre-computed error table and has a specified maximum number of bit errors;
calculating a set of all possible received vectors, x, based on said received vector, v, and said set of all possible error vectors, e,
determining a k-bit code-vector x that is closest to said received vector, v; and
determining an n-bit data-vector, d, associated with the k-bit code-vector x.

16. The article of manufacture of claim 15, wherein said computing step computes said syndrome vector S, as follows:

$$S=vH$$

where H is a parity check matrix.

17. The article of manufacture of claim 15, wherein said pre-computed error table is generated by multiplying all possible error vectors by a Syndrome Matrix, to obtain all possible syndrome vectors associated with all possible error vectors.

18. The article of manufacture of claim 17, wherein said pre-computed error table provides a search sphere of possible error vectors around said received vector.

19. The article of manufacture of claim 15, wherein said step of determining said k-bit code-vector x that is closest to said received vector, v, applies a maximum likelihood criterion.

20. The article of manufacture of claim 15, wherein said set of all possible received vectors, x, is calculated as follows:

$x = XOR(v,e)$.

* * * * *